United States Patent [19]

Dakesian et al.

[11] Patent Number: 5,419,822
[45] Date of Patent: May 30, 1995

[54] METHOD FOR APPLYING A THIN ADHERENT LAYER

[75] Inventors: Sahag R. Dakesian, Sudbury; William E. Wesolowski, Holden, both of Mass.

[73] Assignee: Raytheon Company, Lexington, Mass.

[21] Appl. No.: 316,617

[22] Filed: Feb. 28, 1989

[51] Int. Cl.$^6$ .............................................. C23C 14/00
[52] U.S. Cl. ........................... 204/192.3; 204/192.35; 204/298.07
[58] Field of Search ............ 204/192.15, 192.3, 192.32, 204/192.35, 298 C, 298 ET, 298 E, 298.07

[56] References Cited

U.S. PATENT DOCUMENTS

| | | | |
|---|---|---|---|
| 3,451,912 | 6/1969 | Dheurler et al. | 204/192.3 X |
| 3,661,747 | 5/1972 | Byrnes, Jr. et al. | 204/192.3 X |
| 3,836,446 | 9/1974 | Tiefert | 204/192.3 X |
| 4,129,848 | 12/1978 | Frank et al. | 338/308 |
| 4,468,437 | 8/1984 | Patten et al. | 204/192.3 X |
| 4,756,810 | 7/1988 | Lamont, Jr. et al. | 204/192.3 |
| 4,816,126 | 3/1989 | Kamoshida et al. | 204/192.3 |

Primary Examiner—Peter A. Nelson
Attorney, Agent, or Firm—Walter F. Dawson

[57] ABSTRACT

A method for applying an extremely thin layer of an adherent material to a substrate at a controllable rate. The disclosed embodiment provides a method for depositing a thin layer of titanium, typically much less than 100 Angstroms, on a silicon dioxide substrate layer in order to provide the necessary adhesion for a metallic film. A silicon wafer having a layer of silicon dioxide is placed on a titanium precoated carrier in an evacuated chamber. The wafer and carrier are then sputter etched using argon as a sputter etchant while titanium is deposited onto the wafer. The ratio of deposition rate to etching rate is controlled to provide a very low effective deposition rate. Thus, while the surface is being atomically cleaned, the adhesive layer is simultaneously deposited. A film of a noble metal, typically platinum, may then be deposited onto the adhesive layer. In an alternative embodiment, the titanium is sputter deposited from a target while the substrate is simultaneously sputter etched.

32 Claims, 1 Drawing Sheet

METHOD FOR APPLYING A THIN ADHERENT LAYER

The United States Government has rights in this invention pursuant to Contract No. N00030-81-C-0075 awarded by the Department of the Navy.

BACKGROUND OF THE INVENTION

This invention relates generally to adhesive bonding and, more particularly, to a method for depositing controlled amounts of a thin, nearly monolayer adherent material onto a substrate.

In the fabrication of thin film circuits, noble metals generally serve as conductors for interconnecting devices on a common substrate. However, because of the generally poor adhesion of noble metals to ceramic or dielectric type substrates or layers, an adhesive layer is commonly required to anchor the noble metal to the underlying substrate or layer. In the prior art, the thickness of these adhesive layers has generally ranged from 100 to 1000 Angstrom units (Å).

It is known that the use of adhesive layers in this range of thickness gives rise to a number of practical limitations. In many applications where a noble metal such as platinum may serve as a resistor or conductor, a typical adhesive layer of 100–1000Å thickness increases the difficulty of achieving the optimum electrical properties of the designed resistor or conductor because of the subsequent diffusion or migration of the adhesive layer material into the conductive layer during stabilization or assembly processes, usually performed at elevated temperatures, typically between 300° C. and 900° C. In addition, where noble metals are used as conductors in high frequency microwave circuits, an adhesive layer of 100–1000Å or greater may contribute to RF losses at these frequencies.

In U.S. Pat. No. 4,129,848, "Platinum Film Resistor Device," issued Dec. 12, 1978, to R. J. Frank and T. E. Salzer, the shortcomings of an adhesion layer were recognized, the cited shortcomings, however, referring to a relatively thick adhesion layer. The patent teaches a method of providing a silicon substrate having a silicon dioxide layer, sputter etching the layer of silicon dioxide to produce etch pits upon its exposed surface, sputter depositing a first quantity of platinum on the pitted surface of the silicon dioxide layer at a first power level for a first time period, and sputter depositing a second quantity of platinum over the first quantity at a reduced power level for a longer time period. The patent disclosure indicates that the pits or holes formed in the silicon dioxide layer enhances the adherence of the platinum film thereto.

Nevertheless, the present inventors have found that the above-described process has proved unsatisfactory in some circumstances. In particular, the adhesion between the deposited platinum and the pitted silicon dioxide layer has not been reliably maintained, especially following the extreme temperature conditions of an annealing step. It is believed to be necessary to provide an adhesive layer, such as titanium, between the substrate and the noble metal film, to provide optimum adhesion therebetween, yet an adhesion layer sufficiently thin that it does not significantly affect the electrical or thermal characteristics of the noble metal film.

SUMMARY OF THE INVENTION

Accordingly, it is an object of the present invention to provide a method for depositing on a substrate a thin layer of less than 100Å thickness which may serve as an adherent for a thin film of a noble metal or other thin film material.

This and other objects are obtained generally by a method for applying a thin layer of a material to a substrate, the method comprising the steps of: (a) providing a substrate holder having thereon a coating of the material; (b) placing the substrate on the substrate holder in a chamber; (c) reducing the background in the chamber to below a predetermined maximum contaminant level; (d) simultaneously etching the substrate while depositing the material on the substrate, the rate of deposition and the rate of etching being controllable, wherein the ratio of the rate of deposition to the rate of etching is such as to provide an effective deposition rate of less than five Angstroms per minute.

The present invention is used to advantage in a method for adhering a film to a substrate, the method comprising the steps of: (a) providing a substrate holder having thereon a coating of an adhesive material; (b) placing the substrate on the substrate holder in a chamber; (c) reducing the background in the chamber to below a predetermined maximum contaminant level; (d) simultaneously etching the substrate while depositing the adhesive material on the substrate, the rate of deposition and the rate of etching being controllable, wherein the ratio of the rate of deposition to the rate of etching is such as to provide an effective deposition rate of less than five Angstroms per minute; and (e) depositing the film onto the deposited adhesive material.

DESCRIPTION OF THE PREFERRED EMBODIMENTS

Figure 1:
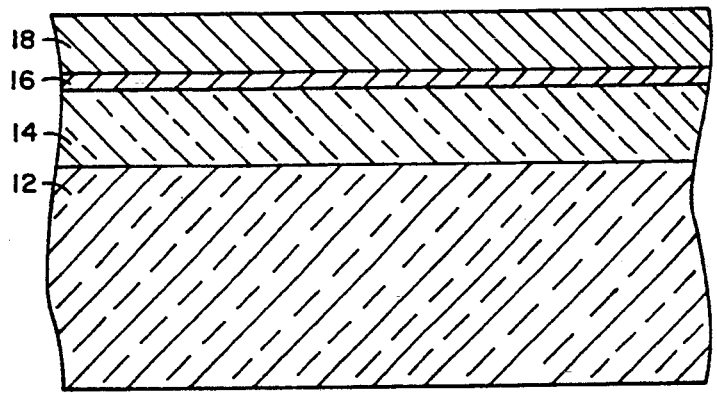
FIG. 1 is a cross-sectional view of a substrate section fabricated in accordance with the present invention.

Referring initially to FIG. 1, there is shown a cross-sectional view of a substrate fabricated according to the principles taught herein. It will be recognized that the thicknesses of the respective layers are highly exaggerated and bear no scaled dimensional relation one to each other. The substrate of FIG. 1 includes a base wafer 12, typically of silicon, onto which there has been grown or deposited a dielectric layer 14, typically of silicon dioxide. A very thin layer 16 of a material used as an adherent is applied to layer 14, and the film 18, typically a conductive metal such as platinum or gold, is deposited onto the adhesive layer 16.

Further steps for processing the above-described substrates into devices, such as etching the metallic film layer 18 to form conductive paths, resistors, etc., and annealing the metallic film 18 by heating the device, are all well known in the art and may be as described in the above-cited Frank et al. patent. Such further processing steps do not form a part of this invention, which is directed mainly to the method for applying adhesive layer 16.

Figure 2:
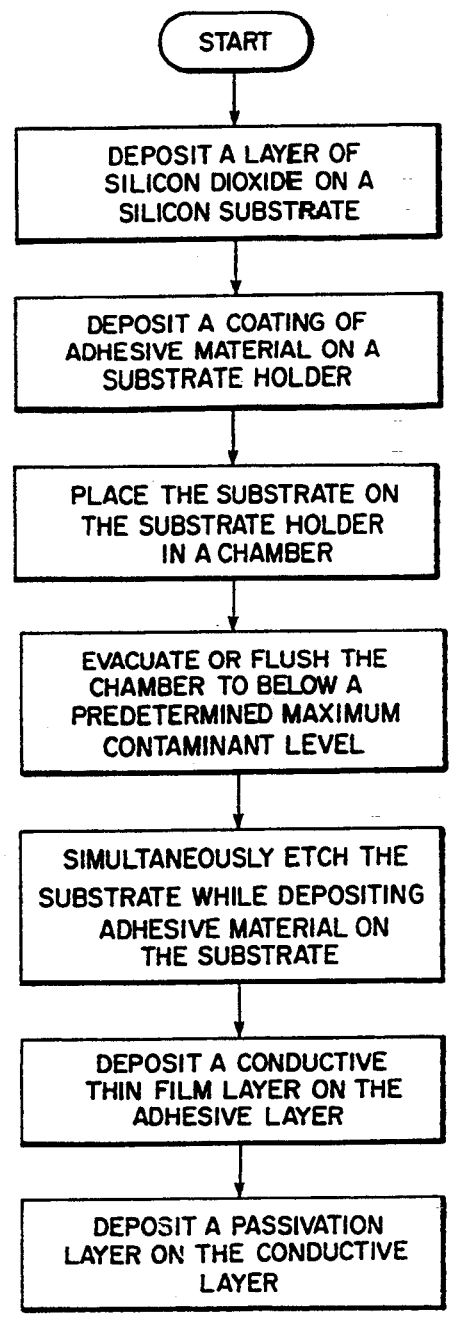
FIG. 2 is a flow diagram showing the basic process steps according to the present invention.

The basic steps for attaching an extremely thin layer of a material, such as adhesive layer 16, to a base substrate according to the principles of the present invention are shown in FIG. 2, and will be described in detail in the following paragraphs. Before the process begins, it is necessary to provide a substantially planar base substrate having at least one substantially smooth surface and which has been cleaned of any surface contaminants. Silicon or other semiconductor material is preferred as the planar base substrate, although other materials such as ceramics may be used as well.

After the substrate has been cleaned of any contaminants upon the upper surface thereof, a layer of silicon dioxide is grown on the cleaned surface. This layer may be produced by sputter depositing silicon dioxide upon the upper surface of the substrate. However, the silicon dioxide layer is preferably grown as a layer of thermal oxide upon a silicon substrate by heating the substrate in an oxygen-containing atmosphere. The thickness of the substrate and the silicon dioxide layer is dependent upon the application to which the device is to be put. In general, the thicker the layer and substrate are made, the higher will be the thermal resistance of the finished device. It may be stated, however, that the silicon dioxide layer should have a minimum thickness of approximately 1000 Å to insure that there are no pinholes through the layer after the subsequent processing steps including depositing, adhering, annealing and etching the metal film layer. A thickness of approximately 2000 Å has been found to be appropriate for devices having a relatively low thermal resistance. Thickness of 10,000 Å or more may be used when it is desirable to increase the thermal resistance of the device.

A process of the present invention, according to a first embodiment thereof, commences by providing a cleaned platen or substrate carrier of the type typically employed in vacuum sputtering processes. Cleaning of the platen is carried out according to usual cleaning processes well known by those skilled in the art. This is followed by the step of vacuum depositing a known thickness of the material to be used as the adhesive layer, e.g., chromium or titanium, onto the precleaned platen. The thickness of the deposited adhesive layer, typically titanium, should be sufficient to supply a continuous source of the desired adherent material during the sputter etch process to be described in a later paragraph. By way of illustration, an adherent layer of titanium 3000-5000 Å thick may be deposited on the platen.

Devices fabricated according to the method of the present invention may be processed either singly or several at one time. However, when RF sputter etching, it is desirable to maintain a relatively high ratio between the areas of the platen (coated with the layer of adhesive material) and the substrates, preferably ten to one or greater, when depending on back-scatter deposition to create the adherent layer.

Once the platen has been precoated, the substrates are positioned on the platen and the entire assembly is placed in the vacuum chamber. In the present embodiment, the chamber is evacuated down to vacuum pressures typically used to maintain a clean and controllable atmosphere prior to sputter etching or deposition of the adhesive material. For this application, an illustrative vacuum chamber pressure of $5 \times 10^{-7}$ Torr may be used. Alternatively, in other embodiments, the chamber may be flushed with the etchant or deposition gas(es). Either method serves to reduce the background in the chamber to below a predetermined maximum contaminant level.

After the desired vacuum pressure has been achieved, the substrates are sputter etched using an ionizable gas, typically argon, neon or krypton, as the sputter etchant. By way of illustration, this step may be carried out using argon gas at ten millitorrs pressure for five to ten minutes using a sputtering power of one-half to two watts per square inch.

During this step, the ionized gas atoms used to etch the substrates also bombard the titanium coating on the platen, causing titanium atoms to eject from the coating layer into the plasma, where they are further bombarded by argon gas ions or atoms. Some of these free titanium atoms are driven onto the substrates. Thus, while the surface of the substrate is being atomically cleaned, the adhesive layer is simultaneously deposited.

This process permits the independent control of the simultaneous etching of the substrate and deposition of the free titanium atoms on the substrate. Thus, the rate of etching and the rate of deposition may be controlled at such a ratio as to establish a desired effective deposition rate. An effective deposition rate of less than five Angstroms per minute may be used in applying a thin layer of adherent to a substrate. An effective deposition rate of less than one Angstrom per minute has been found to be more desirable and easily achieved using the disclosed process.

Using the process of the present embodiment, a number of substrate samples were coated with a thin layer of titanium for five minutes. These samples were analyzed using Auger Electron Spectroscopy, a known surface analysis technique capable of surface sensitivity as low as approximately 10 Å to 40 Å. The analysis indicated the titanium content to be between 1.8 and 4.0 atomic percent of a 50 Å sputter etched layer from the surface of the sample. In terms of thickness, these measurements translate to deposition rates of between 0.2 Å and 0.4 Å of titanium per minute. These very low effective rates of deposition are not reliably or repeatably achieved by known sputter deposition techniques.

This coating technique causes the optimization of the deposition process for obtaining good adherent coatings on any type of surface. In addition, because of the very low effective deposition power density utilized during the process of simultaneous etching and depositing, very thin layers, illustratively much less than 100 Å, can be controllably deposited.

It is believed that this process provides a particularly strong bond between the substrate material and the sputtered adhesive material. Since the sputter etching process which ejects the titanium atoms from the platen coating also etches the titanium which is simultaneously being deposited on the substrate, it is theorized that only those titanium atoms which have achieved a particularly strong bond with the substrate will preferentially survive the ongoing etching process.

Following the application of the adhesive layer to the substrate, a platinum film is sputter deposited upon the surface of the adhesive layer using a two-step process. First, a small amount of platinum is sputter deposited at a first relatively high power level during a first relatively short time period. By way of illustration, this first step may deposit platinum at a power of 15 watts per square inch for approximately five seconds. During the second portion of the platinum deposition process, the power is reduced while sputter deposition of platinum continues until a desired platinum film thickness is achieved. In the present illustration, this second step may use a power level of five watts per square inch for a length of time, typically several minutes, until a total thickness of 1600–2000 Å of platinum is deposited. Alternatively, a platinum film may be deposited upon the surface of the adhesive layer using evaporation.

It has been seen that this thickness of platinum has good adhesive properties and results in a film with sheet resistance of 1.0–1.5 ohms per square after stabilization at 900° C. for two hours in air. Without the adhesive layer of titanium, it has been seen that the platinum film does not have adequate adhesion to the underlying silicon dioxide layer, especially after the above-mentioned stabilization process.

In a second embodiment of the present invention, titanium atoms are sputtered from a target, rather than solely from a pre-coat on the platen as in the first embodiment, while the substrate is being sputter etched. The method of this embodiment allows further control of the effective deposition rate of the adherent material and, since there is no requirement of a large ratio of platen area to substrate area, permits the simultaneous processing of larger numbers of substrates, when compared with the first embodiment.

The material used as the adherent layer has been illustratively disclosed as titanium or chromium. It has additionally been found that the material subsequently used for the thin film deposition, illustratively platinum, may be controllably deposited according to the process of the present invention, and an improved adhesion of the subsequent film, deposited according to known techniques, is achieved.

The embodiments of the present invention as disclosed herein teach sputter etching of the substrate while simultaneously sputter depositing the adherent material onto the substrate. Nevertheless, it will be easily recognized by those skilled in the art that other types of etching, e.g., ion-beam etching, chemical vapor etching, or laser ablation, may be substituted for the described sputter etching in the disclosed processes, without departing from the spirit of the present invention. Furthermore, it will also be recognized that other types of deposition methods, e.g., ion-beam deposition, chemical vapor deposition, electron beam gun evaporation, or laser ablation, may be substituted for the described sputter deposition in the disclosed processes. A combination of scanned laser ablation for etching while depositing by chemical vapor deposition is deemed to be particularly effective.

The following two examples represent specific processes which practice the invention of adhering a platinum film to a dielectric layer on a silicon wafer. The first example involves the process of the first disclosed embodiment, wherein the deposition of the adherent material is provided by back-scatter from the titanium pre-coating on the platen while the wafer (and platen) are sputter etched. The second example involves the process of the second disclosed embodiment, wherein the wafer is sputter etched while it is simultaneously sputter deposited from a titanium target.

EXAMPLE 1

The practice of this example required a sputtering system, such as Model 32, sold by GCA/Vacuum Industries, of Somerville, Mass., or its equivalent. This system has eight-inch diameter sputtering targets. The chamber is fitted with a full diameter shutter having a single target opening. Initially, titanium was sputter deposited at 10 millitorrs argon pressure onto the rotating substrate table and the platens at 400 watts for 20 minutes. Next, a platen, selected for coating the silicon wafers, was oriented under the titanium target and pre-coated at 400 watts for 10 minutes. For each subsequent run, the pre-coatings were repeated.

The silicon substrates, comprising silicon wafers coated with silicon dioxide, were loaded onto the titanium pre-coated platen. During each run, it was possible to process a maximum of four wafers two inches in diameter, or two wafers three inches in diameter. In addition, thickness coupon monitors were loaded on the pre-coated platen. The system was closed and vacuum pumped to at least $5 \times 10^{-7}$ Torr.

The silicon dioxide target was first pre-sputtered at 500 watts RF for 10 minutes onto the space between platens. Then, the titanium target was pre-sputtered at 400 watts RF for 10 minutes over the same area (the area coated with $SiO_2$), and finally, the platinum target was pre-sputtered at 300 watts RF for 10 minutes over the same area. During these pre-sputtering operations, the platen containing the silicon substrates was positioned as far away as possible from the target being pre-sputtered and the associated shutter opening.

The target shutter was then oriented so that the opening was just in front of the titanium target, while positioning the platen with the silicon substrates as far away from this area as was possible. The plasma was activated and the silicon substrates, platen and table were sputter etched at 1.9 watts/in$^2$ RF, based on total table area, for 8 minutes. Next, the platinum target was pre-sputtered at 750 watts RF for one minute, while keeping the platen with the substrates a good distance away. Immediately, the substrate table was rotated so that the platen with the silicon substrates was directly under the platinum target, and the platinum was initially sputtered at 750 watts RF for 6 seconds. Then, the RF power was immediately reduced to 200 watts, and the platinum continued to be sputtered for 7.5 minutes.

A passivation film of $SiO_2$ was provided over the adhered platinum layer by the following steps: While the silicon substrates were still positioned under the platinum target, the silicon dioxide target was turned on and pre-sputtered at 500 watts RF for 5 minutes. Immediately, the silicon substrates were rotated under the $SiO_2$ target and the $SiO_2$ was sputtered at 500 watts RF for 32 minutes.

After cooling to below 50° C., the system was unloaded and the thicknesses of the platinum layer and the $SiO_2$ passivation layer on one of the coupons were measured. The platinum thickness was in the range of 1800–2000 Å, and the $SiO_2$ thickness was in the range of 4000–4500 Å. At this point, the sheet resistivity of the platinum film was determined to be in the range of 1.5–1.6 ohms per square.

The platinum film was annealed by the following steps: The $SiO_2$-platinum coated substrates and a test coupon were loaded into a quartz substrate holder, and the holder loaded into a quartz-tube annealing furnace. Once the substrate holder was in the center of the heating zone, the substrates were annealed at 900° C. in clean, dry air for two hours. After annealing and unloading the substrates and test coupon, the $SiO_2$ coating was etched off the platinum from the coupon, and the sheet resistivity of the platinum was measured and determined to be in the range of 1.0–1.2 ohms per square.

At this stage, the passivated platinum-coated silicon wafer was ready for subsequent photolithographic and metallization processes such as those used to produce platinum film resistor devices of a type described in the

EXAMPLE 2

This example specifically describes a process for adhering a platinum film to a dielectric layer on a silicon wafer in accordance with the second-disclosed embodiment involving sputter etching the wafer while simultaneously depositing from a target. The practice of this example requires a deposition system, such as Model 4410/30, sold by Perkin-Elmer Co., of Norwalk, Conn., or its equivalent. The system is fitted with 8-inch titanium, platinum and quartz targets. The targets have shapers which mask portions of the target faces to provide uniform depositions on the rotating, annular substrate platen, which comprises the entire etchable working surface.

Initially, titanium is sputtered onto the rotating substrate platen using DC magnetron deposition at one kilowatt for 15 minutes. The coated platen is cooled under vacuum for 30 minutes and the silicon wafers are loaded onto the coated platen in the load lock portion of the deposition system. While the platen is in the load lock, the $SiO_2$ target is presputtered onto the back of the target shutter at 900 watts RF magnetron for five minutes, and the platinum target is similarly presputtered at two kilowatts DC magnetron for five minutes.

The wafer-bearing platen is transported into the chamber from the load lock and rapidly pumped to a vacuum pressure below $5 \times 10^{-7}$ Torr. Argon gas is flowed into the chamber at a rate so as to maintain ten millitorrs pressure, and RF sputter etching is stabilized at 750 watts (2 watts/inch) on the rotating platen. The titanium target is simultaneously sputtered by DC magnetron at 290 watts for eight minutes onto the rotating platen. At the end of this period, the RF power and the DC power are simultaneously turned off. This completes the application of the adhesive layer to the wafer.

The platinum film is then applied onto the adherent by sputtering the platinum target onto the rotating substrate platen at 1.5 kilowatts DC magnetron for seven minutes. The silicon dioxide passivation layer is applied by sputtering the $SiO_2$ target onto the rotating substrate platen at 900 watts RF magnetron for 150 minutes. After cooling under vacuum, the wafers are unloaded from the chamber and further processed as in Example 1

While the principles of the present invention have been demonstrated with particular regard to the illustrated methods heretofore disclosed, it will be recognized that various departures from such illustrative methods may be undertaken in the practice of the invention. As an example, although the disclosure is directed toward electrical applications of the disclosed invention, it will be recognized that these methods may also be used to affix a wear layer to a tool, e.g., adhering a layer of carbide to a bearing. The scope of this invention is therefore not intended to be limited to the particular methods disclosed herein but should instead be gauged by the breadth of the claims which follow.

What is claimed is:

1. A method for applying a thin layer of a material to a substrate, comprising the steps of:
   a) providing a substrate holder having thereon a coating of said material;
   b) placing said substrate on said substrate holder in a chamber;
   c) reducing the background in said chamber to below a predetermined maximum contaminant level; and
   d) simultaneously etching said substrate while depositing said material on said substrate, the rate of deposition and the rate of etching being controllable, wherein the ratio of said rate of deposition to said rate of etching is such as to provide an effective deposition rate on said substrate of less than five Angstroms per minute.

2. The method according to claim 1 wherein said material comprises an adherent.

3. The method according to claim 1 wherein said material comprises titanium.

4. The method according to claim 1 wherein said substrate comprises silicon.

5. The method according to claim 4 wherein said silicon substrate further includes a layer of silicon dioxide.

6. The method according to claim 1 wherein said background reducing step comprises evacuating said chamber to a pressure no greater than $5 \times 10^{-7}$ Torr.

7. The method according to claim 1 wherein said etching step comprises sputter etching.

8. The method according to claim 7 wherein said sputter etching step is performed using argon gas as an etchant.

9. The method according to claim 1 wherein said depositing step comprises sputter depositing.

10. The method according to claim 9 wherein said coating is sputter etched from said substrate holder and is deposited on said substrate by back-scatter deposition.

11. The method according to claim 10 wherein the surface of said substrate holder onto which said substrate is placed has an area at least ten times greater than the area of the surface of said substrate onto which said material is sputter deposited.

12. The method according to claim 9 wherein said sputter depositing step comprises the step of sputtering a target of said material, the particles sputtered from said target being deposited on said substrate.

13. The method according to claim 1 wherein said deposition rate and said etching rate are controlled so as to provide an effective deposition rate of less than one Angstrom per minute.

14. The method according to claim 1 wherein said deposition rate and said etching rate are controlled so as to provide an effective deposition rate of less than 0.4 Angstrom per minute.

15. A method for adhering a film to a substrate, comprising the steps of:
   a) providing a substrate holder having thereon a coating of an adherent material;
   b) placing said substrate on said substrate holder in a chamber;
   c) reducing the background in said chamber to below a predetermined maximum contaminant level;
   d) simultaneously etching said substrate while depositing said adherent material on said substrate, the rate of deposition and the rate of etching being controllable, wherein the ratio of said rate of deposition to said rate of etching is such as to provide an effective deposition rate on said substrate of less than five Angstroms per minute; and
   e) depositing said film onto said deposited adherent material.

16. The method according to claim 15 wherein said film comprises a noble metal.

17. The method according to claim 16 wherein said noble metal film comprises platinum.

18. The method according to claim 15 wherein said adherent material comprises titanium.

19. The method according to claim 15 wherein said substrate comprises silicon.

20. The method according to claim 19 wherein said silicon substrate further includes a layer of silicon dioxide.

21. The method according to claim 15 wherein said background reducing step comprises evacuating said chamber to a pressure no greater than $5 \times 10^{-7}$ Torr.

22. The method according to claim 15 wherein said etching step comprises sputter etching.

23. The method according to claim 22 wherein said sputter etching step is performed using argon gas as an etchant.

24. The method according to claim 15 wherein said depositing step comprises sputter depositing.

25. The method according to claim 24 wherein said coating is sputter etched from said substrate holder and is deposited on said substrate by back-scatter deposition.

26. The method according to claim 25 wherein the surface of said substrate holder onto which said substrate is placed has an area at least ten times greater than the area of the surface of said substrate onto which said adherent material is sputter deposited.

27. The method according to claim 24 wherein said sputter depositing step comprises the step of sputtering a target of said material, the particles sputtered from said target being deposited on said substrate.

28. The method according to claim 15 wherein said deposition rate and said etching rate are controlled so as to provide an effective deposition rate of less than one Angstrom per minute.

29. The method according to claim 15 wherein said deposition rate and said etching rate are controlled so as to provide an effective deposition rate of less than 0.4 Angstrom per minute.

30. The method according to claim 15 wherein said film material is deposited onto said adherent material by sputter deposition.

31. The method according to claim 30 wherein said step of sputter depositing said film comprises the following substeps:
f) sputter depositing said film material at a first power level during a first time duration; and
g) sputter depositing said film material at a second power level, less than said first power level, during a second time duration, greater than said first duration.

32. The method according to claim 15 where said film material is deposited onto said adherent material by evaporation.

* * * * *